(12) United States Patent
Curran et al.

(10) Patent No.: US 8,772,629 B2
(45) Date of Patent: Jul. 8, 2014

(54) FIBER PHOTOVOLTAIC DEVICES AND APPLICATIONS THEREOF

(75) Inventors: Seamus A. Curran, Houston, TX (US); David L. Carroll, Winston-Salem, NC (US); James Lee Dewald, Sr., Alamogordo, NM (US)

(73) Assignees: Wake Forest University, Winston-Salem, NC (US); Arrowhead Center, Inc., Las Cruces, NM (US)

( * ) Notice: Subject to any disclaimer, the term of this patent is extended or adjusted under 35 U.S.C. 154(b) by 288 days.

(21) Appl. No.: 12/298,936

(22) PCT Filed: May 1, 2007

(86) PCT No.: PCT/US2007/067925
§ 371 (c)(1),
(2), (4) Date: May 1, 2009

(87) PCT Pub. No.: WO2007/130972
PCT Pub. Date: Nov. 15, 2007

(65) Prior Publication Data
US 2009/0301565 A1    Dec. 10, 2009

Related U.S. Application Data

(60) Provisional application No. 60/796,608, filed on May 1, 2006.

(51) Int. Cl.
| H01L 31/00 | (2006.01) |
|---|---|
| H01L 21/00 | (2006.01) |
| H01L 51/44 | (2006.01) |
| H01L 51/42 | (2006.01) |
| B82Y 10/00 | (2011.01) |
| H01L 51/00 | (2006.01) |
| C08L 65/00 | (2006.01) |
| H01L 27/30 | (2006.01) |

(52) U.S. Cl.
CPC ........... *H01L 51/4253* (2013.01); *H01L 5/0037* (2013.01); *H01L 51/0036* (2013.01); *C08L 65/00* (2013.01); *C08G 2261/91* (2013.01); *H01L 51/441* (2013.01); *Y02E 10/549* (2013.01); *H01L 51/0077* (2013.01); *H01L 2251/308* (2013.01); *H01L 51/0048* (2013.01); *H01L 27/304* (2013.01); *B82Y 10/00* (2013.01); *H01L 51/0047* (2013.01)
USPC ........................... 136/256; 136/259; 136/263

(58) Field of Classification Search
CPC .................. H01L 31/0203; H01L 31/022466; H01L 51/441; H01L 31/035281
USPC .................................. 136/263, 256, 257, 259
See application file for complete search history.

(56) References Cited

U.S. PATENT DOCUMENTS 4,913,744 A    4/1990 Hoegl et al.
(Continued)

FOREIGN PATENT DOCUMENTS

DE         69908016         8/2004
(Continued)

OTHER PUBLICATIONS

X. Wang, X. Kong, G. Shan, Y. Yu, Y. Suan, L. Feng, K. Chao, S. Lu, Y. Li, "Luminescence spectroscopy and visible upconversion properties of Er3+ in ZnP nanocrystals", J. Phys. Chem. B, 2004, vol. 108, p. 18408-18413.*
(Continued)

*Primary Examiner* — Jennifer Michener
*Assistant Examiner* — Marla D McConnell
(74) *Attorney, Agent, or Firm* — J. Clinton Wimbish; Smith Moore Leatherwood LLP

(57) ABSTRACT

The present invention relates to organic optoelectronic devices and, in particular, to organic photovoltaic devices having a fiber structure. In one embodiment, a photovoltaic device comprises a first electrode comprising an indium tin oxide fiber, at least one photosensitive organic layer surrounding the first electrode and electrically connected to the first electrode, and a second electrode surrounding the organic layer and electrically connected to the organic layer.

23 Claims, 6 Drawing Sheets

(56) References Cited

U.S. PATENT DOCUMENTS

| | | | |
|---|---|---|---|
| 6,093,757 | A | 7/2000 | Pern |
| 6,340,789 | B1 | 1/2002 | Petritsch et al. |
| 6,399,873 | B1 * | 6/2002 | Sano et al. ............ 136/249 |
| 6,420,031 | B1 | 7/2002 | Parthasarathy et al. |
| 6,538,375 | B1 | 3/2003 | Duggal et al. |
| 6,576,341 | B1 | 6/2003 | Davey et al. |
| 6,580,027 | B2 | 6/2003 | Forrest et al. |
| 6,657,378 | B2 | 12/2003 | Forrest et al. |
| 6,667,360 | B1 | 12/2003 | Ng et al. |
| 6,946,597 | B2 * | 9/2005 | Sager et al. ............. 136/263 |
| 7,026,079 | B2 | 4/2006 | Louwet et al. |
| 7,194,173 | B2 | 3/2007 | Shtein et al. |
| 7,358,291 | B2 | 4/2008 | Curran et al. |
| 2002/0160553 | A1 | 10/2002 | Yamanaka et al. |
| 2002/0189666 | A1 | 12/2002 | Forrest et al. |
| 2003/0006401 | A1 | 1/2003 | Haghighat et al. |
| 2003/0035979 | A1 | 2/2003 | Chen et al. |
| 2003/0096113 | A1 | 5/2003 | Jacobson et al. |
| 2003/0099858 | A1 | 5/2003 | Duggal et al. |
| 2003/0136943 | A1 | 7/2003 | Alivisatos et al. |
| 2003/0168756 | A1 | 9/2003 | Balkus, Jr. et al. |
| 2003/0178607 | A1 | 9/2003 | Swager et al. |
| 2004/0102577 | A1 | 5/2004 | Hsu et al. |
| 2004/0118448 | A1 | 6/2004 | Scher et al. |
| 2004/0124504 | A1 | 7/2004 | Hsu |
| 2004/0127637 | A1 | 7/2004 | Hsu et al. |
| 2004/0187911 | A1 | 9/2004 | Gaudiana et al. |
| 2004/0187917 | A1 | 9/2004 | Pichler |
| 2004/0202436 | A1 | 10/2004 | Cho et al. |
| 2004/0241900 | A1 | 12/2004 | Tsukamoto et al. |
| 2004/0256001 | A1 | 12/2004 | Mitra et al. |
| 2005/0009224 | A1 | 1/2005 | Yang et al. |
| 2005/0042556 | A1 | 2/2005 | Louwet et al. |
| 2005/0056815 | A1 | 3/2005 | Miteva et al. |
| 2005/0061363 | A1 | 3/2005 | Ginley et al. |
| 2005/0074706 | A1 | 4/2005 | Bristol et al. |
| 2005/0110145 | A1 | 5/2005 | Elers |
| 2005/0159581 | A1 | 7/2005 | Vanderzande et al. |
| 2005/0189014 | A1 | 9/2005 | Gaudiana et al. |
| 2005/0209388 | A1 | 9/2005 | Hsu et al. |
| 2005/0211293 | A1 | 9/2005 | Enomoto et al. |
| 2005/0211294 | A1 | 9/2005 | Chittibabu et al. |
| 2005/0224788 | A1 | 10/2005 | Hsu et al. |
| 2005/0236035 | A1 | 10/2005 | Yang et al. |
| 2005/0257827 | A1 | 11/2005 | Gaudiana et al. |
| 2005/0263178 | A1 | 12/2005 | Montello et al. |
| 2005/0263179 | A1 | 12/2005 | Gaudiana et al. |
| 2005/0263180 | A1 | 12/2005 | Montello et al. |
| 2005/0268962 | A1 | 12/2005 | Gaudiana et al. |
| 2005/0274408 | A1 | 12/2005 | Li et al. |
| 2006/0005876 | A1 | 1/2006 | Gaudiana et al. |
| 2006/0013549 | A1 | 1/2006 | Shtein et al. |
| 2006/0021647 | A1 | 2/2006 | Gui et al. |
| 2006/0027834 | A1 | 2/2006 | Forest et al. |
| 2006/0076048 | A1 | 4/2006 | Gaudiana et al. |
| 2006/0079626 | A1 | 4/2006 | Curran et al. |
| 2006/0090791 | A1 | 5/2006 | Gaudiana et al. |
| 2006/0096633 | A1 | 5/2006 | Chu |
| 2006/0107997 | A1 | 5/2006 | Matsui et al. |
| 2006/0118768 | A1 | 6/2006 | Liu et al. |
| 2006/0159611 | A1 | 7/2006 | Hummelen et al. |
| 2006/0185714 | A1 * | 8/2006 | Nam et al. ............. 136/244 |
| 2006/0201390 | A1 | 9/2006 | Lahann et al. |
| 2006/0211272 | A1 | 9/2006 | Lee et al. |
| 2006/0216610 | A1 | 9/2006 | Galvin et al. |
| 2006/0225778 | A1 | 10/2006 | Brabec et al. |
| 2006/0225782 | A1 | 10/2006 | Berke et al. |
| 2006/0243959 | A1 | 11/2006 | Sargent et al. |
| 2006/0249203 | A1 | 11/2006 | Li et al. |
| 2006/0252853 | A1 | 11/2006 | Ajayan et al. |
| 2006/0257657 | A1 | 11/2006 | Curran et al. |
| 2006/0261733 | A1 | 11/2006 | Suzuki et al. |
| 2006/0266982 | A1 | 11/2006 | Su et al. |
| 2006/0272701 | A1 | 12/2006 | Ajayan et al. |
| 2006/0293426 | A1 | 12/2006 | Curran et al. |
| 2007/0012349 | A1 | 1/2007 | Gaudiana et al. |
| 2007/0014939 | A1 | 1/2007 | Gaudiana et al. |
| 2007/0037302 | A1 | 2/2007 | Gaudiana et al. |
| 2007/0051941 | A1 | 3/2007 | Duerr et al. |
| 2007/0082140 | A1 | 4/2007 | Suzuki et al. |
| 2007/0089779 | A1 | 4/2007 | Balasubramanian et al. |
| 2007/0096085 | A1 | 5/2007 | Rand et al. |
| 2007/0102694 | A1 | 5/2007 | Drndic et al. |
| 2007/0108539 | A1 | 5/2007 | Brabec et al. |
| 2007/0112133 | A1 | 5/2007 | Lee et al. |
| 2007/0115399 | A1 | 5/2007 | Brabec et al. |
| 2007/0138483 | A1 | 6/2007 | Lee et al. |
| 2007/0176174 | A1 | 8/2007 | Lee et al. |
| 2007/0224464 | A1 | 9/2007 | Balasubramanian et al. |
| 2007/0275498 | A1 | 11/2007 | Beecher et al. |
| 2007/0278481 | A1 | 12/2007 | Lee et al. |
| 2007/0289626 | A1 | 12/2007 | Brabee et al. |
| 2007/0290197 | A1 | 12/2007 | Firon et al. |
| 2008/0006322 | A1 | 1/2008 | Wang et al. |
| 2008/0020208 | A1 | 1/2008 | Lee et al. |
| 2008/0041447 | A1 | 2/2008 | Tseng et al. |
| 2008/0066802 | A1 | 3/2008 | Reddy |
| 2008/0110494 | A1 | 5/2008 | Reddy |
| 2008/0230120 | A1 | 9/2008 | Reddy |
| 2008/0308148 | A1 | 12/2008 | Leidholm et al. |
| 2009/0050207 | A1 | 2/2009 | Galvin et al. |
| 2009/0084436 | A1 | 4/2009 | Yang et al. |
| 2009/0120491 | A1 | 5/2009 | Berson et al. |
| 2009/0126796 | A1 | 5/2009 | Yang et al. |
| 2009/0173372 | A1 | 7/2009 | Carroll et al. |
| 2009/0232867 | A1 | 9/2009 | Domb et al. |
| 2009/0242416 | A1 | 10/2009 | Yun et al. |
| 2009/0301565 | A1 | 12/2009 | Curran et al. |

FOREIGN PATENT DOCUMENTS

| | | |
|---|---|---|
| EP | 1 105 772 B1 | 4/1999 |
| EP | 0 949 199 A1 | 10/1999 |
| EP | 1 180 805 A2 | 2/2002 |
| EP | 1 470 597 B1 | 1/2003 |
| EP | 0 949 199 B1 | 5/2003 |
| EP | 1 672 653 A2 | 12/2005 |
| GB | 2 430 679 A | 9/2005 |
| JP | 63232467 A | 9/1988 |
| WO | WO-01/55697 A1 | 2/2001 |
| WO | WO-2003/065471 A2 | 8/2003 |
| WO | WO-2004/046031 A1 | 3/2004 |
| WO | WO-2004/053464 A1 | 6/2004 |
| WO | WO-2004/053546 A1 | 6/2004 |
| WO | 2005029657 A1 | 3/2005 |
| WO | WO-2005/050757 A2 | 6/2005 |
| WO | WO-2005/050757 A3 | 6/2005 |
| WO | WO-2005/124891 A1 | 12/2005 |
| WO | 2006019576 A1 | 2/2006 |
| WO | WO-2006/083308 A2 | 8/2006 |
| WO | WO-2006/083308 A3 | 8/2006 |
| WO | WO-2006-098783 A2 | 9/2006 |
| WO | WO-2006/098783 A3 | 9/2006 |
| WO | WO-2007/022221 A2 | 2/2007 |
| WO | WO-2007/029275 A1 | 3/2007 |
| WO | WO-2007/076843 A1 | 7/2007 |
| WO | WO-2007/100600 A2 | 9/2007 |
| WO | WO-2007/100600 A3 | 9/2007 |
| WO | WO-2007/130972 A2 | 11/2007 |
| WO | WO-2008/012079 A1 | 1/2008 |
| WO | WO-2009/012465 A9 | 1/2009 |

OTHER PUBLICATIONS

K.M. Coakley and M.D. McGehee, "Conjugated Polymer Photovoltaic Cells" Chem. Mater. 2004, vol. 16, p. 4533-4542.*

S. Ferrere and B.A. Gregg, New perylenes for dye sensitization of TiO2, New J. Chem., 2002, vol. 26, p. 1155-1160.*

Hoppe et al., Nanoscale Morphology of Conjugated Polymer/Fullerene-Based Bulk-Heterojunction Solar Cells, Adv. Funct. Mater., Oct. 2004, pp. 1005-1011, vol. 14, Wiley-VCH Verlag GmbH & Co. KGaA, Weinheim.

(56) References Cited

OTHER PUBLICATIONS

Tsuzuki et al., The effect of fullerene doping on photoelectric conversion using titanyl phthalocyanine and a perylene pigment, Solar Energy Materials & Solar Cells, 2000, pp. 1-8, vol. 61, Elsevier Science B.V.
Kang et al., Highly Efficient Polymer Gel Electrolytes for Dye-Sensitized Solar Cells, 3rd World Conference on Photovoltaic Energy Conversion, Osaka, Japan, May 11-18, 2003, pp. 204-207.
Frogley et al., Mechanical properties of carbon nanoparticle-reinforced elastomers, Composites Science and Technology, 2003, pp. 1647-1654, vol. 63, Elsevier Ltd.
Tammela et al., Potential of nanoparticle technologies for next generation erbium-doped fibers, Optical Fiber Communication Conference, Feb. 2004, 3 pgs, vol. 2.
Huynh et al., CdSe Nanocrystal Rods/Poly(3-hexylthiophene) Composite Photovoltaic Devices, Adv. Mater., 1999, pp. 923-927, vol. 11, No. 11, WILEY-VCH Verlag GmbH, Weinheim.
Kim et al, Journal of Applied Physics, vol. 86, No. 11, Dec. 1, 1999, pp. 6451-6461.
Hass et al, Journal of the Optical Society of America, vol. 51, No. 7, Jul. 1961, pp. 719-722.
Applicant-Initiated Interview Summary for U.S. Appl. No. 12/298,942, notification date May 16, 2013; 3 pgs.
International Search Report and Written Opinion of the International Searching Authority, PCT/US2008/082262, international filing date Mar. 11, 2008, 10 pages.
International Search Report and Written Opinion of the International Searching Authority, PCT/US2007/017544, international filing date Jul. 8, 2007, 15 pages.
Supplementary European Search Report, dated Sep. 15, 2009, Application No. EP 07 76 1674, 2 pages.
International Search Report and Written Opinion of the International Searching Authority, PCT/US07/67925, international filing date May 1, 2007, 9 pages.
International Search Report and Written Opinion of the International Searching Authority PCT/US2006/016730, international filing May 1, 2006, 10 pages.
Peter Peumans, Soichi Uchida and Stephen R. Forrest, *Efficient Bulk Heterojunction Photovoltaic Cells Using Small-Molecular-Weight Organic Thin Films*, Letters to Nature, vol. 425, Sep. 11, 2003, pp. 158-162.
C. Strumpel, M.McCann, C. del Canizo, I. Tobias and P. Fath, *Erbium-Doped Up-Converters on Silicon Solar Cells: Assessment of the Potential*, 4 pages, 2005.
Sean E. Shaheen, Chrostph J. Brabec and N. Serdar Sariciftci, *2.5% Efficient Organic Plastic Solar Cells*, Applied Physics Letters, vol. 78, No. 6, Feb. 5, 2001, pp. 841-843.
Marisol Reyes-Reyes, et al., *Meso-Structure Formation for Enhanced Organic Photovoltaic Cells*, Organic Letters, 2005, vol. 7, No. 26, pp. 5749-5752.
Wei Chen, Alan G. Joly, Jan-Olle Malm and Jan-Olov Bovin, *Upconversion Luminescence of $Eu^{3+}$ and $Mn^{2+}$ in $ZnS:Mn^{2+}$, $Eu^{3+}$ Codoped Nanoparticles*, Journal of Applied Physics, vol. 95, No. 2, Jan. 15, 2004, pp. 667-672.
L A Diaz-Torres et al., *Concentration Enhanced Red Upconversion in Nanocrystalline $ZrO_2$: Er under IR Excitation*, Journal of Physics D: Applied Physics, Sep. 1, 2004, 2 pages.
M. Cadek, J.N. Coleman and V. Barron, *Morphological and Mechanical Properties of Carbon-Nanotube-Reinforced Semicrystalline and Amorphous Polymer Composites*, Applied Physics Letters, vol. 81, No. 27, Dec. 30, 2002, pp. 5123-5125.
M. Cadek, et al., *Reinforcement of Polymers with Carbon Nanotubes: The Role of Nanotube Surface Area*, Nano Letters, 2004 vol. 4., No. 2 pp. 353-356.
M. J. Biercuk, et al., *Carbon Nanotube Composites for Thermal Management*, Applied Physics Letters, vol. 80, No. 15, Apr. 15, 2002, pp. 2767-2769.
Rowan Blake, et al., *a Generic Organometallic Approach Toward Ultra-Strong Carbon Nanotube Polymer Composites*, J. Am. Chem. Soc. 2004, vol. 126, No. 33, pp. 10226-10227.
P. Peumans and S.R. Forrest, *Very-high-efficiency Double-heterostructure Copper Phthalocyanine/$C_{60}$ Photovoltaic Cells*, Applied Physics Letters, vol. 79, No. 1., Jul. 2, 2001, pp. 126-128.
A. Yakomov and S. R. Forrest, *High Photovoltage Multiple-heterojunction Organic Solar Cells Incorporating Interfacial Metallic Nanoclusters*, Applied Physics Letters, vol. 80, No. 9, Mar. 4, 2002, pp. 1667-1669.
C.N.R. Rao, et al, Nanotubes, Chemphyschem 2001, 2, pp. 78-105.
Henk W. CH. Postma, et al., *Carbon Nanotube Single-Electron Transistors at Room Temperature*, Science, vol. 293, Jul. 6, 2001, pp. 76-79.
P.M. Ajayan, *Nanotubes from Carbon*, Chem. Rev. 99, (1990) pp. 1787-1799.
J. Bernhole, et al., *Mechanical and Electrical Properties of Nanotubes*, Annu. Rev. Mater. Res. 32, (2002), pp. 347-375.
L. Dai and A.W.H. Mau, *Controlled Synthesis and Modificaton of Carbon Nanotubes and $C_{60}$: Carbon Nanostructures for Advanced Polymeric Composite Materials*, Adv. Mater, 13, (2001) pp. 899-913.
D. Qian and E.C. Dickey, *Load Transfer and Deformation Mechanisms in Carbon Nanotube-Polystyrene Composites*, Appl. Phys. Lett. vol. 76, May 2000, pp. 2868-2870.
S.J. Tans, et al., *Room-temperature transistor based on a single carbon nanotube*, Letters to Nature, vol. 393, pp. 49-52, 1998.
M.S. Dresselhaus, et al., Carbon Nanotubes: Synthesis, Structure, Properties, and Applications, Springer-Verlag, Berlin, 2001, 8 pages.
Seamus Curran, David Gutin, and James Dewald, *The cascade solar cell*, SPIE Newsroom, 2 pages, 2006.

* cited by examiner

FIBER PHOTOVOLTAIC DEVICES AND APPLICATIONS THEREOF

PRIOR RELATED U.S. APPLICATION DATA

This application hereby claims priority to U.S. Provisional Patent Application Ser. No. 60/796,608, filed May 1, 2006.

STATEMENT OF GOVERNMENT LICENSE RIGHTS

This invention was made through the support of the Department of Defense (United States Air Force Office of Scientific Research (AFOSR) Grant No. FA9550-04-1-0161). The Federal Government may retain certain license rights in this invention.

FIELD OF THE INVENTION

The present invention relates to organic optoelectronic devices and, in particular, to organic photovoltaic devices having a fiber structure.

BACKGROUND OF THE INVENTION

Optoelectronic devices using organic materials are becoming increasingly desirable in a wide variety of applications for a number of reasons. Materials used to construct organic optoelectronic devices are relatively inexpensive in comparison to their inorganic counterparts thereby providing cost advantages over optoelectronic devices produced with inorganic materials. Moreover, organic materials provide desirable physical properties, such as flexibility, permitting their use in applications unsuitable for rigid materials. Examples of organic optoelectronic devices comprise organic photovoltaic cells, organic light emitting devices (OLEDs), and organic photodetectors.

Photovoltaic devices convert electromagnetic radiation into electricity by producing a photo-generated current when connected across a load and exposed to light. The electrical power generated by photovoltaic cells can be used in many applications including lighting, heating, battery charging, and powering devices requiring electrical energy.

When irradiated under an infinite load, a photovoltaic device produces its maximum possible voltage, the open circuit voltage or $V_{oc}$. When irradiated with its electrical contacts shorted, a photovoltaic device produces its maximum current, I short circuit or $I_{sc}$. Under operating conditions, a photovoltaic device is connected to a finite load, and the electrical power output is equal to the product of the current and voltage. The maximum power generated by a photovoltaic device cannot exceed the product of $V_{oc}$ and $I_{sc}$. When the load value is optimized for maximum power generation, the current and voltage have the values $I_{max}$ and $V_{max}$ respectively.

A key characteristic in evaluating a photovoltaic cell's performance is the fill factor, ff. The fill factor is the ratio of the photovoltaic cell's actual power to its power if both current and voltage were at their maxima. The fill factor of a photovoltaic cell is provided according to equation (1).

$$ff = (I_{max} V_{mas})(I_{sc} V_{oc}) \qquad (1)$$

The fill factor of a photovoltaic is always less than 1, as $I_{sc}$ and $V_{oc}$ are never obtained simultaneously under operating conditions. Nevertheless, as the fill factor approaches a value of 1, a device demonstrates less internal resistance and, therefore, delivers a greater percentage of electrical power to the load under optimal conditions.

Photovoltaic devices may additionally be characterized by their efficiency of converting electromagnetic energy into electrical energy. The conversion efficiency, $\eta_p$, of a photovoltaic device is provided according to equation (2) where $P_{inc}$ is the power of the light incident on the photovoltaic.

$$\eta_p = f^*(I_{sc} V_{oc})/P_{inc} \qquad (2)$$

Devices utilizing crystalline or amorphous silicon dominate commercial applications, and some have achieved efficiencies of 23% or greater. However, efficient crystalline-based devices, especially of large surface area, are difficult and expensive to produce due to the problems in fabricating large crystals free from crystalline defects that promote exciton recombination. Commercially available amorphous silicon photovoltaic cells demonstrate efficiencies ranging from about 4 to 12%.

Constructing organic photovoltaic devices having efficiencies comparable to inorganic devices poses a technical challenge. Some organic photovoltaic devices demonstrate efficiencies on the order of 1% or less. The low efficiencies displayed in organic photovoltaic devices results from a severe length scale mismatch between exciton diffusion length ($L_D$) and organic layer thickness. In order to have efficient absorption of visible electromagnetic radiation, an organic film must have a thickness of about 500 nm. This thickness greatly exceeds exciton diffusion length which is typically about 50 nm, often resulting in exciton recombination.

Organic photovoltaic devices comprising a fiber structure and the use of waveguiding in a method of converting electromagnetic energy to electrical energy have been developed, as set forth in PCT Application entitled *Organic Optoelectronic Devices and Applications Thereof*, filed May 1, 2006 and assigned to Wake Forest University. Organic photovoltaic devices having a fiber structure can provide conversion efficiencies comparable to and greater than inorganic devices. It would be desirable, however, to further enhance the efficiencies of organic photovoltaic devices having a fiber structure.

SUMMARY

The present invention provides organic photovoltaic devices having a fiber structure. In an embodiment, the present invention provides an organic photovoltaic device comprising a first electrode comprising an indium tin oxide fiber, at least one photosensitive organic layer surrounding the first electrode and electrically connected to the first electrode, and a second electrode surrounding the organic layer and electrically connected to the organic layer.

In another embodiment, the present invention provides an organic photovoltaic device comprising a fiber core, a radiation transmissive first electrode surrounding the fiber core, at least one photosensitive organic layer surrounding the first electrode and electrically connected to the first electrode, and a second electrode surrounding the organic layer and electrically connected to the organic layer, wherein the photosensitive organic layer comprises at least one upconverter, anti-Stokes material, laser dye, anti-counterfeiting dye, quantum dot, or combination thereof.

In another embodiment, the present invention provides an optoelectronic device comprising at least one pixel comprising at least one photovoltaic cell, the photovoltaic cell comprising a first electrode comprising an indium tin oxide fiber, at least one photosensitive organic layer surrounding the first electrode and electrically connected to the first electrode, and a second electrode surrounding the organic layer and electrically connected to the organic layer.

In another embodiment, an optoelectronic device comprises at least one pixel comprising at least one photovoltaic cell, the photovoltaic cell comprising a fiber core, a radiation transmissive first electrode surrounding the fiber core, at least one photosensitive organic layer surrounding the first electrode and electrically connected to the first electrode, and a second electrode surrounding the organic layer and electrically connected to the organic layer, wherein the photosensitive organic layer comprises at least one upconverter material, anti-Stokes material, laser dye, anti-counterfeiting dye, quantum dot, or combination thereof.

In some embodiments, a pixel comprises a plurality of photovoltaic cells. In other embodiments, an optoelectronic device comprises an array of pixels. In a further embodiment, an optoelectronic device comprises an array of pixels, each pixel comprising a plurality of photovoltaic cells.

The present invention also provides methods of producing a fiber photovoltaic device comprising providing an optical fiber core, disposing a radiation transmissive first electrode on a surface of the optical fiber core, disposing at least one photosensitive organic layer in electrical communication with the first electrode, and disposing a second electrode in electrical communication with the organic layer, wherein the at least one photosensitive organic layer comprises at least one upconverter material, anti-Stokes material, laser dye, anti-counterfeiting dye, quantum dot, or combination thereof.

In another embodiment, a method for producing a fiber photovoltaic device comprises providing an indium tin oxide fiber core, disposing at least one photosensitive organic layer in electrical communication with the indium tin oxide fiber core, and disposing a second electrode in electrical communication with the photosensitive organic layer.

The present invention additionally provides methods for converting electromagnetic energy into electrical energy. In one embodiment, a method for converting electromagnetic energy into electrical energy comprises receiving radiation along the longitudinal axis of an optical fiber, transmitting the radiation into at least one photosensitive organic layer, generating excitons in the organic layer, and separating the excitons into electrons and holes, wherein the organic layer comprises at least one upconverter material, anti-Stokes material, laser dye, anti-counterfeiting dye, quantum dot, or combination thereof. A method for converting electromagnetic energy into electrical energy, in some embodiments, further comprises removing the electrons into an external circuit.

In another embodiment, a method for converting electromagnetic energy into electrical energy comprises receiving electromagnetic radiation along the longitudinal axis of an indium tin oxide fiber, transmitting the electromagnetic radiation into at least one photosensitive organic layer surrounding the indium tin oxide fiber, generating excitons in the organic layer, and separating the excitons into electrons and holes.

In some embodiments of methods of the present invention, the electromagnetic radiation received comprises visible electromagnetic radiation, infrared electromagnetic radiation, ultraviolet electromagnetic radiation, or combinations thereof.

These and other embodiments are of the present invention are described in greater detail in the detailed description of the invention which follows.

BRIEF DESCRIPTION OF THE FIGURES

FIG. 5 illustrates refraction of electromagnetic radiation traveling in a fiber photovoltaic device according to an embodiment of the present invention.

DETAILED DESCRIPTION

Figure 1:
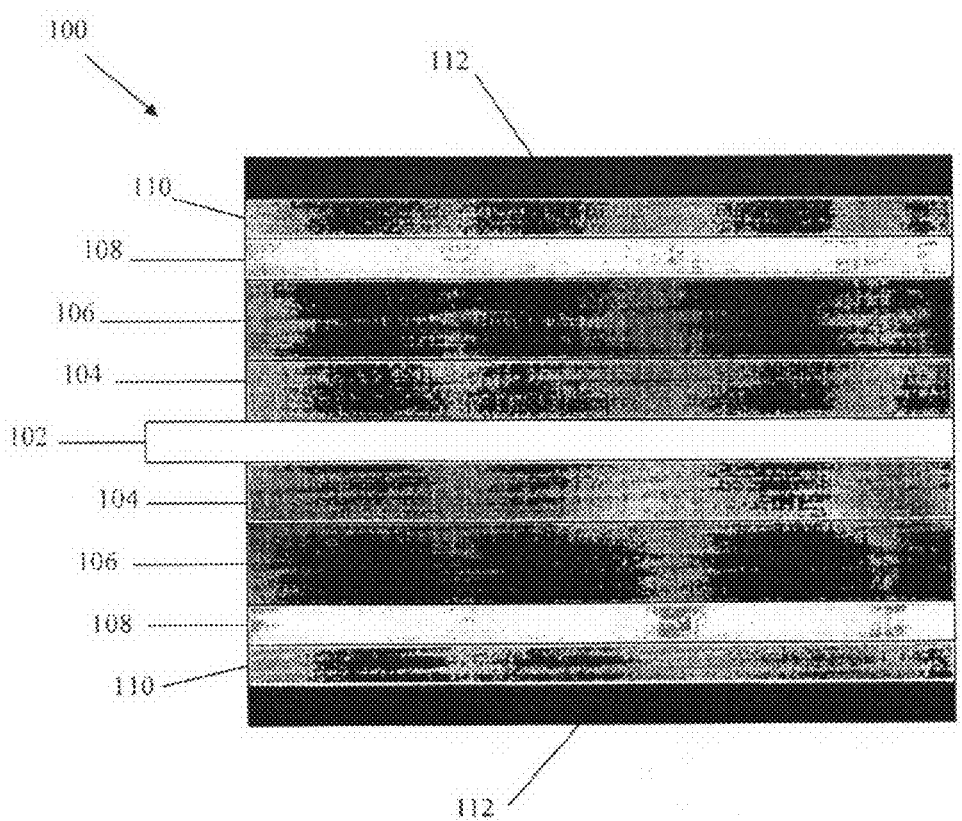
FIG. 1 illustrates cross sectional view of a photovoltaic device comprising a fiber structure according to an embodiment of the present invention.

The present invention provides organic photovoltaic devices having a fiber structure. In one embodiment, the present invention provides an organic photovoltaic device comprising a first electrode comprising an indium tin oxide fiber, at least one photosensitive organic layer surrounding the first electrode and electrically connected to the first electrode, and a second electrode surrounding the organic layer and electrically connected to the organic layer.

In another embodiment, the present invention provides an organic photovoltaic device comprising an optical fiber core, a radiation transmissive first electrode surrounding the optical fiber core, at least one photosensitive organic layer surrounding the first electrode and electrically connected to the first electrode, and a second electrode surrounding the organic layer and electrically connected to the organic layer, wherein the organic layer comprises at least one upconverter material, anti-Stokes material, laser dye, anti-counterfeiting dye, quantum dot, or combination thereof.

Compositions suitable for components of photovoltaic devices according to embodiments of the present invention, including optical fiber cores, first and second electrodes, and photosensitive organic layers, are set forth in the PCT application entitled *Organic Optoelectronic Devices and Applications Thereof*, filed May 1, 2006.

Turning now to components that can be included in various embodiments of photovoltaic devices of the present invention, photovoltaic devices of the present invention comprise an optical fiber core. In some embodiments the present invention, an optical fiber core of a photovoltaic device of the present invention comprises an indium tin oxide fiber. When the optical fiber core comprises an indium tin oxide fiber, a separate and distinct first electrode may be optional. The indium tin oxide fiber core, in some embodiments, serves as both the optical fiber core and first electrode. In other embodiments, a first electrode comprising a radiation transmissive conducting oxide may be disposed on the surface of the indium tin oxide fiber. In such embodiments, the radiation transmissive conducing oxide can comprise gallium indium tin oxide (GITO), zinc indium tin oxide (ZITO), antimony tin oxide (ATO), or indium tin oxide.

In another embodiment, a first electrode comprising a metal having a thickness operable to at least partially transmit visible radiation may be disposed on the surface of the indium tin oxide fiber. Metals suitable for serving as a radiation transmissive first electrode, in some embodiments, comprise elementally pure metals or alloys. In some embodiments, suitable metals comprise metals having a high work function such as gold and silver. In one embodiment, for example, a high work function metal has a work function greater than 4.7 eV. A first electrode comprising a metal can have a thickness operable to at least partially pass visible radiation. In some embodiments, a radiation transmissive first electrode comprising a metal has a thickness ranging from about 50 nm to about 200 nm. In other embodiments, a radiation transmissive first electrode comprising a metal can have a thickness ranging from about 75 nm to about 150 nm. In a further embodiment, a radiation transmissive first electrode comprising a metal has a thickness ranging from about 100 nm to about 125 nm.

In a further embodiment, a radiation transmissive first electrode comprising a composite material comprising a nanoparticle phase dispersed in a polymeric phase may be disposed on the surface of an indium tin oxide fiber. The nanoparticle phase, in one embodiment, can comprise carbon nanotubes, fullerenes, or mixtures thereof.

Moreover, in some embodiments, an optical fiber core comprises glass optical fibers, quartz optical fibers, or plastic optical fibers (POF). Plastic optical fibers, in some embodiments, are constructed of polymethyl methacrylate. In other embodiments, plastic optical fibers are constructed of perfluorocyclobutane (PFBC) containing polymers, such as perfluorocyclobutane poly(arylether)s. Optical fibers, according to some embodiments of the present invention, can comprise single mode optical fibers and multi-mode optical fibers. Optical fibers for use in the present invention, in some embodiments, are flexible.

In some embodiments, an optical fiber core of a photovoltaic device of the present invention has a diameter ranging from about 1 µm to about 2 mm. In other embodiments, an optical fiber core can have a diameter ranging from about 90 µm to about 1 mm. In a further embodiment, a fiber core has a diameter ranging from about 20 µm to about 800 µm.

An optical fiber core, according to some embodiments, has a length ranging from about 500 nm to about 100 mm. In other embodiments, an optical fiber core has a length ranging from about 1 µm to about 1 mm. In a further embodiment, an optical fiber core has a length ranging from about 10 µm to about 100 µm.

In a further embodiment, an optical fiber core of an organic photovoltaic device can be beveled or tapered at one or both ends. Beveling or tapering one or both ends of an optical fiber core, in some embodiments, can enhance reception of electromagnetic radiation by the core. In other embodiments, optical concentrators and/or lenses can be used to increase the amount of electromagnetic radiation received by optical fiber cores of organic photovoltaic devices of the present invention.

Photovoltaic devices, in some embodiments of the present invention, comprise a radiation transmissive first electrode surrounding the optical fiber core. Radiation transmissive, as used herein, refers to the ability to at least partially pass radiation in the visible region of the electromagnetic spectrum. In some embodiments, radiation transmissive materials can pass visible electromagnetic radiation with minimal absorbance or other interference. Moreover, electrodes, as used herein, refer to layers that provide a medium for delivering photo-generated current to an external circuit or providing bias voltage to the optoelectronic device. An electrode provides the interface between the photoactive regions of an organic photovoltaic device and a wire, lead, trace, or other means for transporting the charge carriers to or from the external circuit.

A radiation transmissive first electrode, according to some embodiments of the present invention, comprises a radiation transmissive conducting oxide. Radiation transmissive conducting oxides, in some embodiments, comprises indium tin oxide (ITO), gallium indium tin oxide (GITO), antimony tin oxide (ATO), and zinc indium tin oxide (ZITO). In another embodiment, the radiation transmissive first electrode comprises a radiation transmissive polymeric material such as polyanaline (PANI) and its chemical relatives. In some embodiments, 3,4-polyethylenedioxythiophene (PEDOT) is a suitable radiation transmissive polymeric material for the first electrode. In other embodiments, a radiation transmissive first electrode comprises a carbon nanotube layer having a thickness operable to at least partially pass visible electromagnetic radiation.

In another embodiment, a radiation transmissive first electrode comprises a composite material comprising a nanoparticle phase dispersed in a polymeric phase. The nanoparticle phase, in one embodiment, can comprise carbon nanotubes, fullerenes, or mixtures thereof. In a further embodiment, a radiation transmissive first electrode comprises a metal layer having a thickness operable to at least partially pass visible electromagnetic radiation. In some embodiments, a metal layer can comprise elementally pure metals or alloys. Metals suitable for use as a radiation transmissive first electrode can comprise high work function metals, as described herein.

In some embodiments, a radiation transmissive first electrode has a thickness ranging from about 10 nm to about 1 µm. In other embodiments, a radiation transmissive first electrode has a thickness ranging from about 100 nm to about 900 nm. In another embodiment, a radiation transmissive first electrode has a thickness ranging from about 200 nm to about 800 nm. In a further embodiment, a radiation transmissive first electrode can have a thickness greater than 1 µm.

Photovoltaic devices, in some embodiments of the present invention, comprise at least one photosensitive organic layer comprising at least one upconverter material, anti-Stokes material, laser dye, anti-counterfeiting dye, quantum dot, or combination thereof. Photovoltaic devices, according to some embodiments, can comprise a plurality of photosensitive organic layers.

In some embodiments, a photosensitive organic layer has a thickness ranging from about 30 nm to about 1 µm. In other embodiments, a photosensitive organic layer has a thickness ranging from about 80 nm to about 800 nm. In a further embodiment, a photosensitive organic layer has a thickness ranging from about 100 nm to about 300 nm.

A photosensitve organic layer, according to embodiments of the present invention, comprises at least one photoactive region in which electromagnetic radiation is absorbed to produce excitons which may subsequently dissociate into electrons and holes. In some embodiments, a photoactive region can comprise a polymer. Polymers suitable for use in a photoactive region of a photosensitive organic layer, in one embodiment, can comprise conjugated polymers such as thiophenes including poly(3-hexylthiophene) (P3HT), poly (3-octylthiophene) (P3OT), and polythiophene (PTh).

In some embodiments, polymers suitable for use in a photoactive region of a photosensitive organic layer can comprise semiconducting polymers. In one embodiment, semiconducting polymers include phenylene vinylenes, such as poly(phenylene vinylene) and poly(p-phenylene vinylene) (PPV), and derivatives thereof. In other embodiments, semiconducting polymers comprise poly fluorenes, naphthalenes, and derivatives thereof. In a further embodiment, semiconducting polymers for use in a photoactive region of a photosensitive organic layer comprise poly(2-vinylpyridine) (P2VP), polyamides, poly(N-vinylcarbazole) (PVCZ), polypyrrole (PPy), and polyaniline (PAn).

A photoactive region, according to some embodiments, can comprise small molecules. In one embodiment, small molecules suitable for use in a photoactive region of a photosensitive organic layer comprise coumarin 6, coumarin 30, coumarin 102, coumarin 110, coumarin 153, and coumarin 480 D. In another embodiment, a small molecule comprises merocyanine 540. In a further embodiment, small molecules comprise 9,10-dihydrobenzo[a]pyrene-7(8H)-one, 7-methylbenzo[a]pyrene, pyrene, benzo[e]pyrene, 3,4-dihydroxy-3-cyclobutene-1,2-dione, and 1,3-bis[4-(dimethylamino)phenyl-2,4-dihydroxycyclobutenediylium dihydroxide.

In some embodiments of the present invention, exciton dissociation is precipitated at heterojunctions in the organic layer formed between adjacent donor and acceptor materials. Organic layers, in some embodiments of the present invention, comprise at least one bulk heterojunction formed between donor and acceptor materials. In other embodiments, organic layers comprise a plurality of bulk heterojunctions formed between donor and acceptor materials.

In the context of organic materials, the terms donor and acceptor refer to the relative positions of the highest occupied molecular orbital (HOMO) and lowest unoccupied molecular orbital (LUMO) energy levels of two contacting but different organic materials. This is in contrast to the use of these terms in the inorganic context, where donor and acceptor may refer to types of dopants that may be used to create inorganic n- and p-type layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A photoactive region in a photosensitive organic layer, according to some embodiments of the present invention, comprises a polymeric composite material. The polymeric composite material, in an embodiment, can comprise a nanoparticle phase dispersed in a polymeric phase. Polymers suitable for producing the polymeric phase of a photoactive region can comprise conjugated polymers such as thiophenes including poly(3-hexylthiophene) (P3HT) and poly(3-octylthiophene) (P3OT). In some embodiments, polymers suitable for producing the polymeric phase of the photoactive region comprise poly[2-(3-thienyl)-ethoxy-4-butylsulphonate] (PTEBS), 2-methoxy-5-(3',7'-dimethyloctyloxy)-1,4-phenylene-vinylene (MDMO-PPV), and poly[2-methoxy-5-(2'-ethylhexyloxy)-p-phenylene-vinylene] (MEH-PPV).

In some embodiments, the nanoparticle phase dispersed in the polymeric phase of a polymeric composite material comprises at least one carbon nanoparticle. Carbon nanoparticles can comprise fullerenes, carbon nanotubes, or mixtures thereof. Fullerenes suitable for use in the nanoparticle phase, in one embodiment, can comprise 1-(3-methoxycarbonyl)propyl-1-phenyl(6,6)$C_{61}$ (PCBM). Carbon nanotubes for use in the nanoparticle phase, according to some embodiments, can comprise single-walled nanotubes, multi-walled nanotubes, or mixtures thereof.

In some embodiments of the present invention, the polymer to nanoparticle ratio in polymeric composite materials ranges from about 1:4 to about 1:0.4. In other embodiments, the polymer to nanoparticle ratio in polymeric composite materials ranges from about 1:2 to about 1:0.6. In one embodiment, for example, the ratio of poly(3-hexylthiophene) to PCBM ranges from about 1:1 to about 1:0.4.

In a further embodiment, the nanoparticle phase dispersed in the polymeric phase comprises at least one nanowhisker. A nanowhisker, as used herein, refers to a crystalline carbon nanoparticle formed from a plurality of carbon nanoparticles. Nanowhiskers, in some embodiments, are produced by annealing a photosensitive organic layer comprising the polymeric composite material. Carbon nanoparticles operable to form nanowhiskers, according to some embodiments, can comprise single-walled carbon nanotubes, multi-walled carbon nanotubes, and fullerenes. In one embodiment, nanowhiskers comprise crystalline PCBM. Annealing the photosensitive organic layer, in some embodiments, can further increase the dispersion of the nanoparticle phase in the polymeric phase.

In embodiments of photoactive regions comprising a polymeric phase and a nanoparticle phase, the polymeric phase serves as a donor material and the nanoparticle phase serves as the acceptor material thereby forming a heterojunction for the separation of excitons into holes and electrons. In embodiments wherein nanoparticles are dispersed throughout the polymeric phase, the photoactive region of the organic layer comprises a plurality of bulk heterojunctions.

In further embodiments, donor materials in a photoactive region of a photosensitive organic layer can comprise organometallic compounds including porphyrins, phthalocyanines, and derivatives thereof. Through the use of an organometallic material in the photoactive region, photosensitive devices incorporating such materials may efficiently utilize triplet excitons. It is believed that the singlet-triplet mixing may be so strong for organometallic compounds that the absorptions involve excitation from the singlet ground states directly to the triplet excited states, eliminating the losses associated with conversion from the singlet excited state to the triplet excited state. The longer lifetime and diffusion length of triplet excitons in comparison to singlet excitons may allow for the use of a thicker photoactive region, as the triplet excitons may diffuse a greater distance to reach the donor-acceptor heterojunction, without sacrificing device efficiency.

In further embodiments, acceptor materials in a photoactive region of a photosensitive organic layer can comprise perylenes, naphthalenes, and mixtures thereof.

As provided herein, photosensitive organic layers, according to some embodiments of the present invention, comprise at least one upconverter material, anti-Stokes material, laser dye, anti-counterfeiting dye, quantum dot, or combination thereof. In some embodiments, upconverter materials, anti-Stokes materials, laser dyes, anti-counterfeiting dyes, quantum dots, or combinations thereof are blended into a photosensitive organic layer by techniques known to one of skill in the art.

As understood by one of skill in the art, an upconverter is a material operable to emit electromagnetic radiation having energy greater than that of the electromagnetic radiation absorbed by the material to create the excited state. Upconverters suitable for use in the present invention, in some embodiments, can absorb infrared radiation and emit visible radiation at wavelengths operable to be absorbed by photosensitive organic layers of photovoltaic devices of the present invention.

Upconverters, in some embodiments, include materials comprising at least one Lanthanide series element. In some embodiments, upconverter materials can comprise nanoparticles comprising at least one Lanthanide series element. Lanthanide series elements suitable for use in upconverter materials according to some embodiments of the present invention comprise erbium, ytterbium, dysprosium, holmium, or mixtures thereof. In some embodiments, upconverter materials comprise metal oxides and metal sulfides doped with ions of erbium, ytterbium, dysprosium, holmium, or mixtures thereof. In other embodiments, optical fibers, in addition to the photosensitive organic layer, may be doped directly with ions of erbium, ytterbium, dysprosium, holmium, or mixtures thereof.

In some embodiments, upconverter materials comprise organic chemical species. Organic upconverter materials comprise $H_2C_6N$ and 4-dialkylamino-1,8-naphthalimides as well as 1,8-naphthalimide derivatives and compounds, such as multibranched naphthalimide derivatives TPA-NA1, TPA-NA2, and TPA-NA3. Organic upconverter materials can also comprise 4-(dimethylamino)cinnamonitrile (cis and trans), trans-4-[4-(dimethylamino)styryl]-1-methylpyridinium iodide, 4-[4-(dimethylamino)styryl]pyridine, 4-(diethylamino)benzaldehyde diphenylhydrazone, trans-4-[4-(dimethylamino)styryl]-1-methylpyridinium p-toluenesulfonate, 2-[ethyl [4-[2-(4-nitrophenyl)ethenyl]phenyl]amino]ethanol, 4-dimethylamino-4'-nitrostilbene, Disperse Orange 25, Disperse Orange 3, and Disperse Red 1.

In a further embodiment, upconverter materials can comprise quantum dots. Quantum dots, according to some embodiments, can comprise III/V and II/VI semiconductor materials, such as cadmium selenide (CdSc), cadmium telluride (CdTe), cadmium sulfide (CdS), lead sulfide (PbS), lead selenide (PbSe), and zinc selenide (ZnSe). Upconverter materials can also comprise core-shell architectures of quantum dots.

In addition to those provided herein, embodiments of the present invention contemplate additional upconverter materials comprising transition metals, such as chromium.

Anti-Stokes materials, laser dyes and anti-counterfeiting dyes suitable for incorporation into photosensitive organic layers, according to some embodiments, comprise substituted benzophenones, biphenyls, diphenyls, infrared dyes such as polymethines, and spectral sensitizers such as cyanines and merocyanines. Suitable anti-counterfeiting dyes can comprise phosphors, fluorophors, thermochromic, and/or photochromic chemical species.

Photovoltaic devices of the present invention comprise a second electrode surrounding the photosensitive organic layer. In some embodiments, the second electrode can comprise a metal. As used herein, metal refers to both materials composed of an elementally pure metal, e.g., gold, and also metal alloys comprising materials composed of two or more elementally pure materials. In some embodiments, the second electrode comprises gold, silver, aluminum, copper, or combinations thereof. The second electrode, according to some embodiments, has a thickness ranging from about 10 nm to about 10 μm. In other embodiments, the second electrode has a thickness ranging from about 100 nm to about 1 μm. In a further embodiment, the second electrode can have a thickness ranging from about 200 nm to about 800 nm.

A layer comprising lithium fluoride (LiF), according to some embodiments, can be disposed between a photosensitive organic layer and second electrode. The LiF layer can have a thickness ranging from about 5 angstroms to about 10 angstroms.

In some embodiments, the LiF layer can be at least partially oxidized resulting in a layer comprising lithium oxide ($Li_2O$) and LiF. In other embodiments, the LiF layer can be completely oxidized resulting in a lithium oxide layer deficient or substantially deficient of LiF. In some embodiments, a LiF layer is oxidized by exposing the LiF layer to oxygen, water vapor, or combinations thereof. In one embodiment, for example, a LiF layer is oxidized to a lithium oxide layer by exposure to an atmosphere comprising water vapor and/or oxygen at a partial pressures of less than about $10^{-6}$ Torr. In another embodiment, a LiF layer is oxidized to a lithium oxide layer by exposure to an atmosphere comprising water vapor and/or oxygen at a partial pressures less than about $10^{-7}$ Torr or less than about $10^{-8}$ Torr.

In some embodiments, a LiF layer is exposed to an atmosphere comprising water vapor and/or oxygen for a time period ranging from about 1 hour to about 15 hours. In one embodiment, a LiF layer is exposed to an atmosphere comprising water vapor and/or oxygen for a time period greater than about 15 hours. In a further embodiment, a LiF layer is exposed to an atmosphere comprising water vapor and/or oxygen for a time period less than about one hour. The time period of exposure of the LiF layer to an atmosphere comprising water vapor and/or oxygen, according to some embodiments of the present invention, is dependent upon the partial pressures of the water vapor and/or oxygen in the atmosphere. The higher the partial pressure of the water vapor or oxygen, the shorter the exposure time.

Organic photovoltaic devices, according to some embodiments of the present invention, can further comprise additional layers such as one or more exciton blocking layers. In embodiments of the present invention, an exciton blocking layer (EBL) can act to confine photogenerated excitons to the region near the dissociating interface and prevent parasitic exciton quenching at a photosensitive organic/electrode interface. In addition to limiting the path over which excitons may diffuse, an EBL can additionally act as a diffusion barrier to substances introduced during deposition of the electrodes. In some embodiments, an EBL can have a sufficient thickness to fill pin holes or shorting defects which could otherwise render an organic photovoltaic device inoperable.

An EBL, according to some embodiments of the present invention, comprises a polymeric composite material. In one embodiment, an EBL comprises carbon nanoparticles dispersed in 3,4-polyethyl enedioxythiophene:polystyrenesulfonate (PEDOT:PSS). In another embodiment, an EBL comprises carbon nanoparticles dispersed in poly(vinylidene chloride) and copolymers thereof. Carbon nanoparticles dispersed in the polymeric phases including PEDOT:PSS and poly(vinylidene chloride) can comprise single-walled nanotubes, multi-walled nanotubes, fullerenes, or mixtures thereof. In further embodiments, EBLs can comprise any polymer having a work function energy operable to permit the transport of holes while impeding the passage of electrons.

In some embodiments, an EBL may be disposed between the radiation transmissive first electrode and a photosensitive organic layer of an photovoltaic device. In some embodiments wherein the photovoltaic device comprises a plurality of photosensitive organic layers, EBLs can be disposed between the photosensitive organic layers.

Photovoltaic devices of the present invention, in some embodiments, further comprise a protective layer surrounding the second electrode. The protective layer can provide photovoltaic devices provided herein with increased durability thereby permitting their use in a wide variety of applications including photovoltaic applications. In some embodiments, the protective layer comprises a polymeric composite material. In one embodiment, the protective layer comprises nanoparticles dispersed in poly(vinylidene chloride). Nanoparticles dispersed in poly(vinylidene chloride), according to some embodiments, can comprise single-walled carbon nanotubes, multi-walled carbon nanotubes, fullerenes, or mixtures thereof.

Photovoltaic devices of the present invention, in some embodiments, further comprise an external metallic contact. In one embodiment, the external metallic contact surrounds the second electrode and is in electrical communication with the second electrode. The external metallic contact, in some embodiments, can be operable to extract current over at least a portion of the circumference and length of the fiber photovoltaic device. In other embodiments, the external metal contact can be operable to extract current over the entire length and circumference of the fiber photovoltaic device. External metallic contacts, in some embodiments, can comprise metals including gold, silver, or copper. In a further embodiment, external metal contacts can be operable to reflect non-absorbed electromagnetic radiation back into at least one photosensitive organic layer for further absorption.

Photovoltaic devices, according to some embodiments of the present invention, further comprise charge transfer layers. Charge transfer layers, as used herein, refer to layers which only deliver charge carriers from one section of an photovoltaic device to another section. In one embodiment, for example, a charge transfer layer can comprise an exciton blocking layer.

A charge transfer layer, in some embodiments, can be disposed between a photosensitive organic layer and radiation transmissive first electrode and/or a photosensitive organic layer and second electrode. In other embodiments, charge transfer layers may be disposed between the second electrode and protective layer of an photovoltaic device. Charge transfer layers, according to some embodiments, are not photoactive.

FIG. 1 illustrates a cross-sectional view of a photovoltaic device having a fiber structure according to one embodiment of the present invention. The photovoltaic device (100) shown in FIG. 1 comprises an indium tin oxide fiber core (102). The indium tin oxide (102) optical fiber core is surrounded by an exciton blocking layer (104). In some embodiments, the EBL comprises carbon nanoparticles dispersed in a polymeric phase such as 3,4-polyethylenedioxythiophene (PEDOT) or poly(vinylidene chloride).

The EBL (104) is surrounded by a photosensitive organic layer (106). The photosensitive organic layer (106), in some embodiments, comprises a P3HT-carbon nanoparticle polymeric composite. The photosensitive organic layer (106), in some embodiments, further comprises at least one upconverter material, anti-Stokes material, laser dye, anti-counterfeiting dye, quantum dot, or combination thereof.

The photosensitive organic layer (106), in some embodiments, is in direct electrical communication with the indium tin oxide fiber core (102). In the embodiment illustrated in FIG. 1, an exciton blocking layer (104) is disposed between the indium tin oxide fiber core (102) and the photosensitive organic layer (106) to provide indirect electrical communication between the indium tin oxide fiber core (102) and the photosensitive organic layer (106).

The photosensitive organic layer (106) is surrounded by a second electrode (108). The photosensitive organic layer (106), in some embodiments, is in direct electrical communication with the second electrode (108). In other embodiments, an exciton blocking layer (not shown) may be disposed between the photosensitive organic layer (106) and the second electrode (108) to provide indirect electrical communication between the photosensitive organic layer (106) and the second electrode (108). In some embodiments, the second electrode (106) can comprise a metal. Metals suitable for use as a second electrode (106) can comprise elementally pure metals or alloys. In one embodiment, the second electrode (106) can comprise metals or alloys having a work function less than 3.8 eV, such as calcium, magnesium, and MgIn.

The second electrode (108) is surrounded by a protective layer (110) comprising a polymeric composite material. In some embodiments, the polymeric composite material of the protective layer (110) comprises carbon nanoparticles dispersed in poly(vinylidene chloride) and/or copolymers thereof. The carbon nanoparticles can comprise single-walled carbon nanotubes, multi-walled carbon nanotubes, fullerenes, or mixtures thereof.

The protective layer (110) is surrounded by an external metal contact (112) operable to extract current over a length and circumference of the fiber photovoltaic device. In some embodiments, an external metallic (112) contact can comprise metals including gold, silver, or copper.

Figure 2:
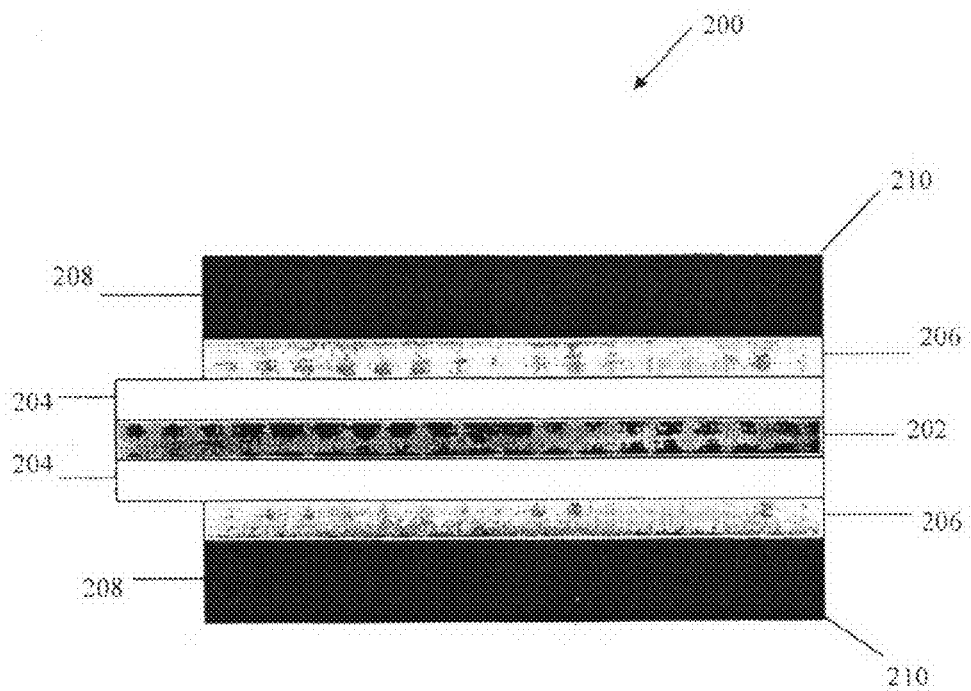
FIG. 2 illustrates cross sectional view of a photovoltaic device comprising a fiber structure according to an embodiment of the present invention.

FIG. 2 illustrates a cross-sectional view of a photovoltaic device comprising a fiber structure according to another embodiment of the present invention. The photovoltaic device (200) displayed in FIG. 2 comprises an optical fiber core (202) and a radiation transmissive first electrode (204) surrounding the optical fiber core (202). An exciton blocking layer (206) surrounds the radiation transmissive first electrode (204), and a photosensitive organic layer (208) surrounds the exciton blocking layer (206) wherein the photosensitive organic layer (208) comprises at least one upconverter, anti-Stokes material, laser dye, anti-counterfeiting dye, quantum dot, or combination thereof. A second electrode (210) surrounds the photosensitive organic layer (208).

In the embodiment shown in FIG. 2, the optical fiber core (202) and radiation transmissive first electrode (204) extend longitudinally beyond the remaining layers of the photovoltaic device (200). The longitudinal extension of the optical fiber core (202) and radiation transmissive first electrode (204), in some embodiments, can facilitate attachment of the photovoltaic device (200) to an external electrical circuit.

Figure 3:
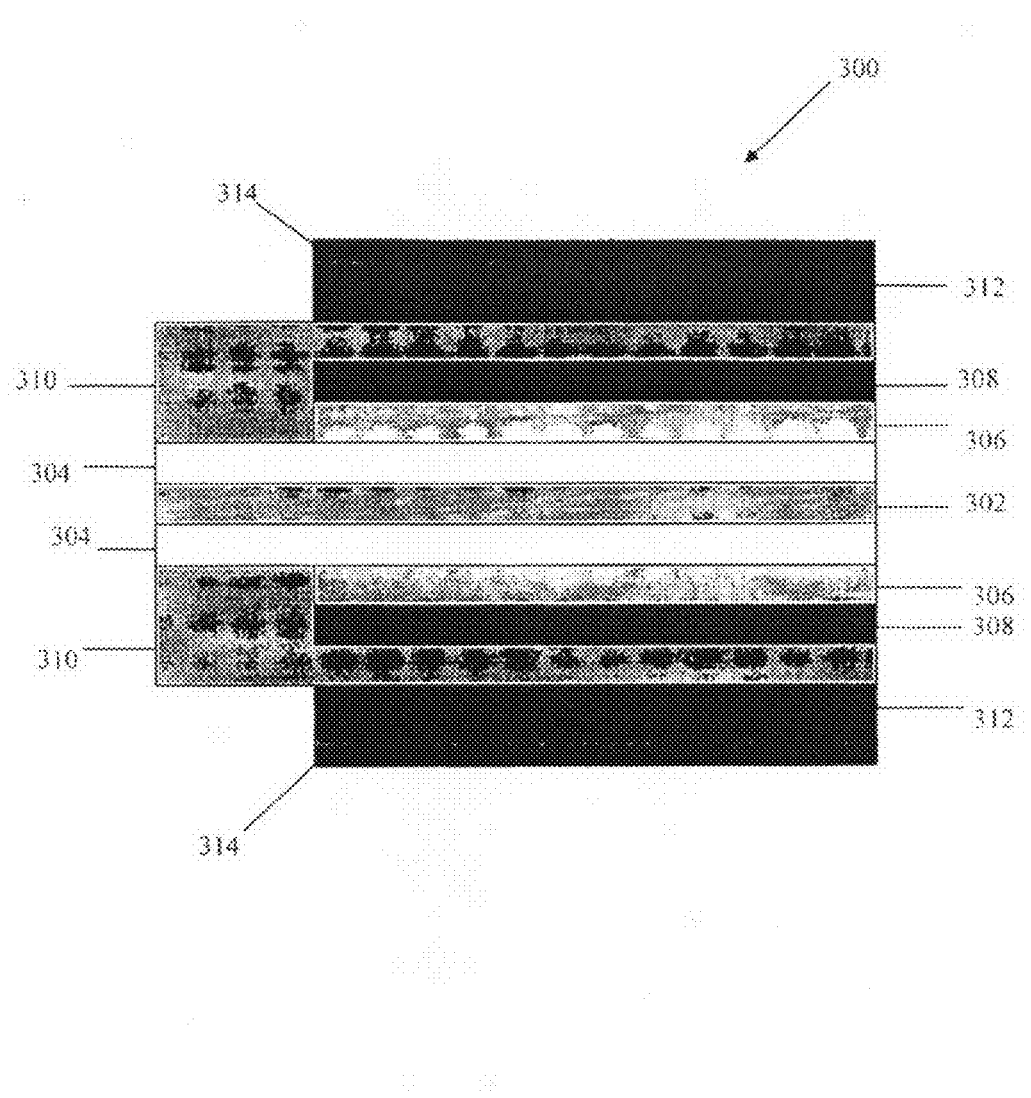
FIG. 3 illustrates cross sectional view of a photovoltaic device comprising a fiber structure according to an embodiment of the present invention.

FIG. 3 illustrates a cross-sectional view of a photovoltaic device comprising a fiber structure according to another embodiment of the present invention, wherein the photovoltaic device comprises a plurality of photosensitive organic layers, and wherein at least one of the photosensitive organic layers comprises at least one upconverter material, anti-Stokes material, laser dye, anti-counterfeiting dye, quantum dot, or combination thereof. The photovoltaic device (300) comprises an optical fiber core (302). The fiber core (302) can comprise a glass optical fiber, a quartz optical fiber, or a plastic optical fiber.

The optical fiber core (302) is surrounded by a radiation transmissive first electrode (304). The radiation transmissive first electrode (304) can comprise a radiation transmissive conducting oxide such as indium tin oxide, gallium indium tin oxide, antimony tin oxide, or zinc indium tin oxide. The radiation transmissive first electrode (304) is surrounded by a first exciton blocking layer (306). In some embodiments, the first EBL (306) can comprise carbon nanoparticles dispersed in a polymeric phase such as 3,4-polyethylenedioxythiophene or poly(vinylidene chloride).

The first EBL (306) is surrounded by a first photosensitive organic layer (308). The first photosensitive organic layer (308), in some embodiments, can comprise a P3HT-carbon nanoparticle polymeric composite. The first photosensitive organic layer (308) is surrounded by a second exciton blocking layer (310). The second EBL, in some embodiments, can also comprise carbon nanoparticles dispersed in 3,4-polyethylenedioxythiophene or poly(vinylidene chloride).

The second EBL is surrounded by a second photosensitive organic layer (312). The second photosensitive organic layer (312), in some embodiments, comprises a polymeric material, including a polymeric composite, having an electromagnetic radiation absorption profile that largely overlaps that of the first organic layer (308). In other embodiments, the second photosensitive organic layer (312) can comprise a polymeric material, including a polymeric composite, having an electromagnetic radiation absorption profile that does not overlap or minimally overlaps that of the first organic layer (308). The second photosensitive organic layer (312) further comprises at least one upconverter material, anti-Stokes material, laser dye, anti-counterfeiting dye, quantum dot, or combination thereof.

The second organic layer (312) is surrounded by a second electrode (314) that can reflect electromagnetic radiation not absorbed by the photosensitive organic layers (308), (312) back into the organic layers for further absorption. The second electrode (314), in some embodiments, comprises a metal, such as aluminum, gold, silver, nickel, or copper.

In the embodiment shown in FIG. 3, the optical fiber core (302), radiation transmissive first electrode (304), and second exciton blocking layer (310) extend longitudinally beyond the remaining layers of the photovoltaic device. The longitudinal extension of the optical fiber core (302), radiation transmissive first electrode (304), and second exciton blocking layer (310) can facilitate attachment of the photovoltaic device (300) to an external electrical circuit.

Although FIG. 3 illustrates a photovoltaic device having two photosensitive organic layers, embodiments of the present invention contemplate photovoltaic devices comprising greater than two photosensitive organic layers, photovoltaic devices having three, four, five, and greater than five photosensitive organic layers. In some embodiments, a photovoltaic device can comprise at least 10 photosensitive organic layers.

A plurality of photosensitive organic layers can be buffered from one another, in some embodiments, by disposing exciton blocking layers between the photosensitive organic layers. By providing a plurality of photosensitive organic layers wherein each layer has a distinct absorption profile, photovoltaic devices of the present invention can increase or maximize exciton generation across the electromagnetic spectrum.

In some embodiments, a photovoltaic device can comprise a fiber core having a plurality of photosensitive regions located along its longitudinal axis, each of the plurality of photosensitive regions comprises a radiation transmissive first electrode surrounding the fiber core, at least one photosensitive organic layer surrounding the first electrode and electrically connected to the first electrode, and a second electrode surrounding the organic layer and electrically connected to the organic layer. Each of the plurality of regions may further comprise additional layers as set forth herein, including additional photosensitive organic and exciton blocking layers as provided in FIG. 3. Moreover, at least one of the photosensitive organic layers further comprises at least one upconverter material, anti-Stokes material, laser dye, anti-counterfeiting dye, quantum dot, or combination thereof.

In some embodiments, organic photovoltaic device as described herein can comprise photovoltaic cells operable for use in a variety of optoelectronic devices. In one embodiment, the present invention provides an optoelectronic device comprising at least one pixel comprising at least one photovoltaic cell, the photovoltaic cell comprising a first electrode comprising an indium tin oxide fiber, at least one photosensitive organic layer surrounding the first electrode and electrically connected to the first electrode, and a second electrode surrounding the organic layer and electrically connected to the organic layer.

In another embodiment, an optoelectronic device comprises at least one pixel comprising at least one photovoltaic cell, the photovoltaic cell comprising an optical fiber core, a radiation transmissive first electrode surrounding the fiber core, at least one photosensitive organic layer surrounding the first electrode and electrically connected to the first electrode, and a second electrode surrounding the organic layer and electrically connected to the organic layer, wherein the photosensitive organic layer comprises at least one upconverter material, anti-Stokes material, laser dye, anti-counterfeiting dye, quantum dot, or combination thereof.

Optoelectronic devices comprising at least one pixel comprising at least one photovoltaic cell, in some embodiments, can have constructions consistent with those provided in the PCT application entitled *Organic Optoelectronic Devices and Application Thereof*, filed May 1, 2006.

Fiber photovoltaic cells for use in pixel applications, in some embodiments of the present invention, are constructed independently from one another. In such embodiments, component materials for one fiber photovoltaic cell are selected without reference to component materials selected for another fiber photovoltaic cell. In one embodiment, for example, one fiber photovoltaic cell can comprise a glass optical fiber core while another photovoltaic cell can comprise an indium tin oxide optical fiber core. As a result, in some embodiments, pixels and pixel arrays are not required to comprise fiber photovoltaic cells of identical construction. Fiber photovoltaic cell construction can be varied in any manner consistent with the materials and methods described herein to produce pixels and pixel arrays suitable for a wide range of applications.

Photovoltaic devices comprising at least one pixel comprising at least one fiber photovoltaic cell, in some embodiments, comprise solar cells. Pixels and pixel arrays can be placed on any suitable substrate, in some embodiments, to produce solar panels. Solar cells and panels comprising fiber photovoltaic cells of the present invention can have conversion efficiencies greater than 6%.

The present invention also provides methods of producing a fiber photovoltaic device comprising providing an optical fiber core, disposing a radiation transmissive first electrode on a surface of the optical fiber core, disposing at least one photosensitive organic layer in electrical communication with the first electrode, and disposing a second electrode in electrical communication with the organic layer, wherein the organic layer comprises at least one upconverter material, anti-Stokes material, laser dye, anti-counterfeiting dye, quantum dot, or combination thereof.

Disposing a radiation transmissive first electrode on an optical fiber core, in some embodiments, comprises sputtering or dip coating a radiation transmissive conductive oxide onto a surface of the optical fiber core. In some embodiments, disposing a photosensitive organic layer in electrical communication with the first electrode comprises depositing the organic layer on the first electrode by dip coating, spin coating, vapor phase deposition, or vacuum thermal annealing. Disposing a second electrode in electrical communication with the photosensitive organic layer, according to some embodiments, comprises depositing the second electrode on the organic layer through vapor phase deposition, spin coating, or dip coating.

In another embodiment, a method of producing a fiber photovoltaic device comprises providing an indium tin oxide fiber core, disposing at least one photosensitive organic layer in electrical communication with the indium tin oxide fiber core, and disposing a second electrode in electrical communication with the photosensitive organic layer. In some embodiments, disposing a photosensitive organic layer in electrical communication with the indium tin oxide fiber comprises depositing the organic layer on the indium tin oxide fiber by dip coating, spin coating, vapor phase deposition, or vacuum thermal annealing. Disposing a second electrode in electrical communication with the photosensitive organic layer, according to some embodiments, comprises depositing the second electrode on the organic layer through vapor phase deposition, spin coating, or dip coating.

Methods of producing a fiber photovoltaic device, in some embodiments, further comprise annealing the photosensitive organic layer or layers. In some embodiments where a photosensitive organic layer comprises a composite material comprising a polymer phase and a nanoparticle phase, annealing the organic layer can produce higher degrees of crystallinity in both the polymer and nanoparticle phases as well as result in greater dispersion of the nanoparticle phase in the polymer phase. Nanoparticle phases comprising fullerenes, single-walled carbon nanotubes, multi-walled carbon nanotubes, or mixtures thereof can form nanowhiskers in the polymeric phase as a result of annealing. Annealing a photosensitive organic layer, according to some embodiments, can comprise heating the organic layer at a temperature ranging from about 80° C. to about 155° C. for a time period of ranging from about 1 minute to about 30 minutes. In some embodiments, a photosensitive organic layer can be heated for about 5 minutes.

In addition to providing organic photovoltaic devices having a fiber structure, the present invention provides methods for converting electromagnetic energy into electrical energy. In one embodiment, a method for converting electromagnetic energy into electrical energy comprises receiving radiation along the longitudinal axis of an optical fiber, transmitting the radiation into at least one photosensitive organic layer, generating excitons in the organic layer, and separating the excitons into electrons and holes, wherein the organic layer comprises at least one upconverter material, anti-Stokes material, laser dye, anti-counterfeiting dye, quantum dot, or combination thereof.

In another embodiment, a method for converting electromagnetic energy into electrical energy comprises receiving radiation along the longitudinal axis of an optical fiber at an incident angle sufficient to produce total internal reflection at an interface of a photosensitive organic layer and an adjacent layer disposed on a surface of the optical fiber. In some embodiments, receiving radiation can comprise positioning the optical fiber to receive radiation at an incident angle sufficient to produce total internal reflection at an interface of a photosensitive organic layer and an adjacent layer. A photosensitive organic layer can be consistent with those provided in embodiments hereinabove. In some embodiments, an adjacent layer can comprise a charge transfer layer, such as an exciton blocking layer. In one embodiment, for example, the adjacent layer can comprise PEDOT.

In some embodiments, electromagnetic energy received at an incident angle sufficient to produce total internal reflection can be refracted by at least one additional layer before reaching the interface of a photosensitive organic layer and an adjacent layer. In some embodiments, additional layers can comprise conducting metal oxides consistent with those provided herein or additional charge transfer layers consistent with those provided herein.

Creating total internal reflection at an interface of a photosensitive organic layer and an adjacent layer can produce evanescence fields or waves in the photosensitive organic layer, which can lead to an increased absorption of electromagnetic radiation by the organic layer. Increasing absorption of electromagnetic radiation in the photosensitive organic layer can produce greater numbers of excitons thereby increasing the conversion efficiencies of organic photovoltaic devices of the present invention.

Figure 4:
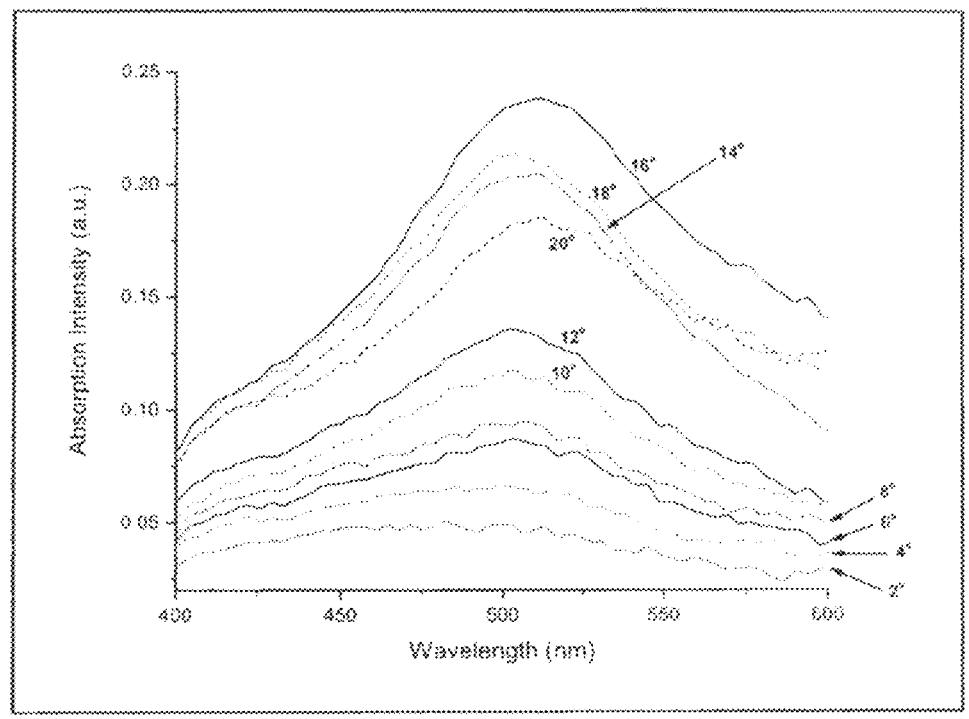
FIG. 4 illustrates absorption intensity spectra as a function of incident angle at a fiber end face of an organic photovoltaic device according to an embodiment of the present invention.
Figure 8:
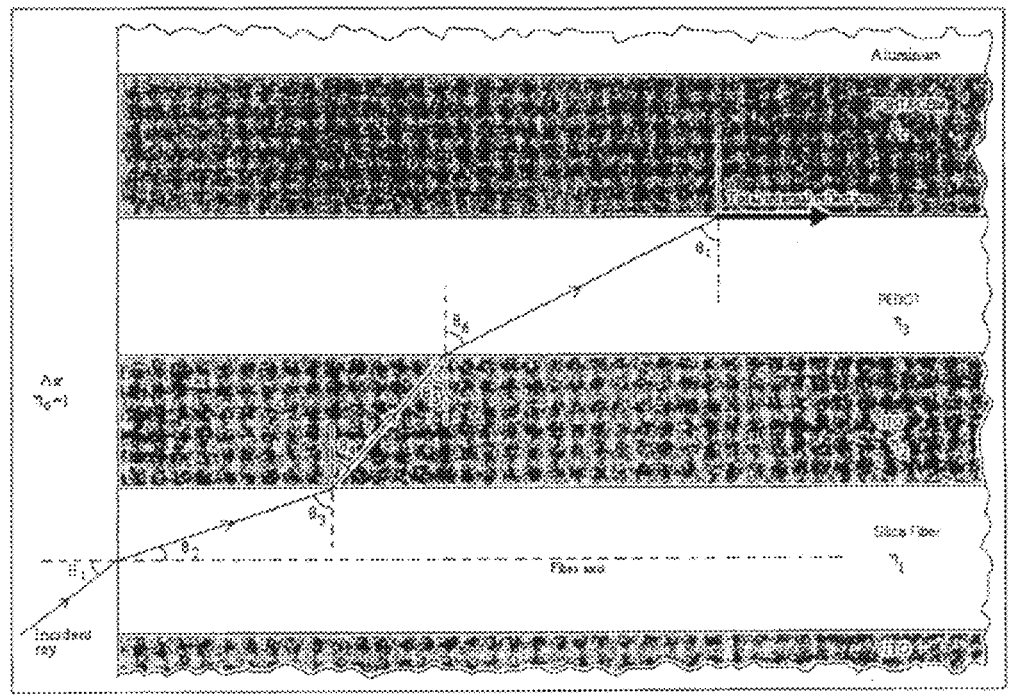

FIG. 4 illustrates absorption intensity spectra as a function of incident angle at a fiber end face of an organic photovoltaic device according to an embodiment of the present invention. The incident angles at the fiber face varied from 2° to 20° in 2° increments. As shown in FIG. 4, the absorption intensity peaked at an incident angle of 16°. The organic photovoltaic device used to generate the spectra provided in FIG. 4 included a photosensitive organic layer comprising a polymeric composite of poly(3-hexylthiophene) and 1-(3-methoxycarbonyl)propyl-1-phenyl(6,6)$C_{61}$ (P3HT/PCBM). The P3HT/PCBM photosensitive organic layer surrounded an adjacent exciton blocking layer comprising PEDOT as illustrated in FIG. 1.

While not wishing to be bound by any theory, it is believed that the radiation was absorbed by the photosensitive organic layer, and an incident angle of about 16° created the condition for total internal reflection at the PEDOT/P3HT:PCBM interface. By creating total internal reflection at the PEDOT/P3HT:PCBM interface, evanescent waves or fields were present in the P3HT:PCBM organic layer producing an increased absorption intensity.

In embodiments of the present invention, the critical angle required for total internal reflection at an interface of a photosensitive organic layer and an adjacent layer can be dependent upon the refractive index of the photosensitive organic layer. By assuming achievement of the critical angle at the interface of the photosensitive organic layer and adjacent layer, the required incident angle at the interface can be calculated. From this, Snell's law can be used at each additional interface produced by the presence of additional layers disposed on the optical fiber core, and the incident angle at the face of the optical fiber can be calculated.

FIG. 5, for example, illustrates refraction of electromagnetic radiation traveling in a fiber photovoltaic device, according to an embodiment of the present invention, which produces total internal reflection at an interface of a photosensitive organic layer and an adjacent layer. In FIG. 5, the photosensitive organic layer comprises a poly(3-hexylthiophene)/1-(3-methoxycarbonyl)propyl-1-phenyl(6,6)$C_{61}$ (P3HT/PCBM) composite, and the adjacent layer comprises PEDOT. An additional layer of indium tin oxide is disposed between the PEDOT layer and surface of the silica optical fiber core. The indium tin oxide layer, as described herein, serves as a radiation transmissive first electrode.

Figure 6:
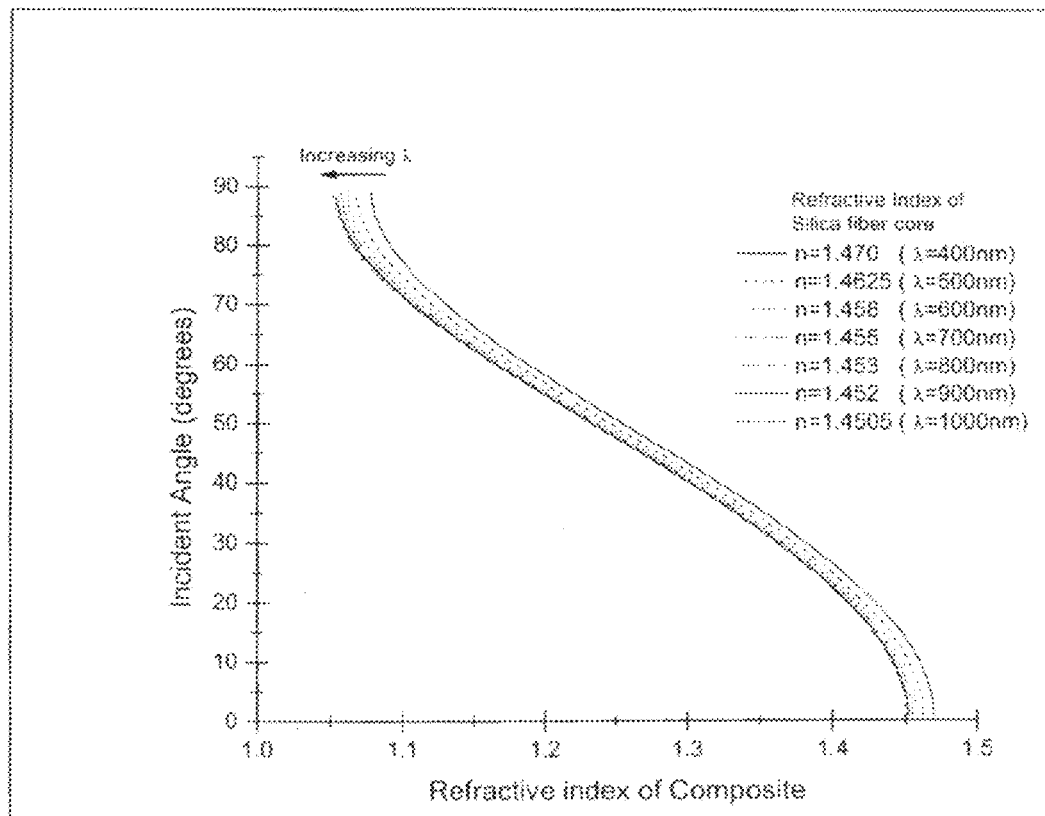
FIG. 6 displays theoretical curves for incident angles as a function of refractive index to achieve total internal reflection at an interface of a photosensitive organic layer according to an embodiment of the present invention.

Applying Snell's law at the various layer interfaces illustrated in FIG. 6 yields:

$$\eta_3 \sin \theta_c = \eta_c \tag{3}$$

$$\eta_2 \sin \theta_5 = \eta_3 \sin \theta_6 \tag{4}$$

$$\eta_1 \sin \theta_3 = \eta_2 \sin \theta_4 \tag{5}$$

wherein $\eta_1$ is the refractive index of the silica optical fiber core, $\eta_2$ is the refractive index of the indium tin oxide layer, $\theta_3$ is the refractive index of the PEDOT layer, and $\eta_c$ is the refractive index of the photosensitive organic layer.

Noticing that $\theta_c = \theta_6$ and $\theta_5 = \theta_4$, we can substitute (3) into (4) and then that result into (5) and rearrange to get $$\theta_3 = \sin^{-1}\left(\frac{\eta_c}{\eta_1}\right). \tag{6}$$

Since $\eta_o = 1$ and $\eta_2 = 90° - \theta_3$, at the air/fiber interface, we have $$\sin \theta_1 = \eta_1 \sin \theta_2 = \eta_1 \cos \theta_3 \tag{7}.$$

Finally, upon substitution of (6) into (7) the theoretical equation becomes $$\sin\theta_1 = \eta_1 \cos\left[\sin^{-1}\left(\frac{\eta_c}{\eta_1}\right)\right]$$

where $\theta_1$ is the incident angle at the fiber interface measured from the normal.

FIG. 6 illustrates theoretical curves displaying incident angles at the face of the optical fiber core as a function of the refractive index of the P3HT:PCBM photosensitive organic layer which are sufficient to achieve the critical angle for total internal reflection at the PEDOT/P3HT:PCBM interface. Each theoretical curve represents a different incident wavelength, which in turn corresponds to a different refractive index for the silica optical fiber core.

As disclosed and taught by PCT application entitled *Optoelectronic Devices and Applications Thereof*, filed May 1, 2006, subsequent to a determination of incident angles sufficient for producing total internal reflection at an interface of a photosensitive organic layer and adjacent layer, an optical fiber core can be positioned to receive radiation in accordance with the incident angles. A panel, for example, constructed of pixels comprising organic photovoltaic cells having a fiber structure can be positioned such that radiation striking the panel can be received by the optical fiber cores of the photovoltaic cells at angles sufficient to produce total internal reflection at an interface of a photosensitive organic layer and an adjacent layer.

In some embodiments, layers of organic photovoltaic devices can be etched to prevent or reduce frustrated total internal reflection. In one embodiment, an exciton blocking layer adjacent to a photosensitive organic layer can be etched on the side forming an interface with the organic layer. An exciton blocking layer comprising PEDOT, for example, can be etched on the side forming an interface with a P3HT/PCBM photosensitive organic layer.

In some embodiments, layers of organic photovoltaic devices can be etched by lithographic methods, including photolithographic methods. In one embodiment, a photolithographic resist is deposited onto the surface of the layer to be etched. Photolithographic resists, according to embodiments of the present invention, comprise positive resists or negative resists. Once the photolithographic resist is deposited, the resist is exposed to radiation and developed with appropriate solvent. A pattern remains on the layer of the photovoltaic device. Photolithographic resists can be laid down in any desired pattern. One pattern, for example, comprises a series of parallel lines spaced apart by a constant distance. After developing the resist, the layer of the organic photovoltaic device is then etched by any suitable polar organic solvent, such as acetone. The photolithographic resist is subsequently stripped from the layer of the organic photovoltaic device leaving behind an etched layer.

In some embodiments, the indium tin oxide fiber is etched. Etching the indium tin oxide fiber, in some embodiments, can be achieved by lithographic processes, including photolithographic processes. In one embodiment, for example, a photolithographic resist is deposited onto the surface of the indium tin oxide fiber. Once the photolithographic resist is deposited, the resist is exposed to radiation and developed with appropriate solvent to produce a pattern on the indium tin oxide fiber. The surface of the indium tin oxide fiber is subsequently etched in a suitable acid, such as chromic acid, sulfuric acid, or nitric acid. The photolithographic resist is then removed or stripped from the surface of the indium tin oxide fiber leaving behind the etched surface. In some embodiments, first electrodes comprising radiation transmissive conducting oxides, including indium tin oxide, are etched in this manner.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A photovoltaic apparatus comprising:
   an optical fiber core;
   a radiation transmissive first electrode surrounding the optical fiber core;
   at least one photosensitive organic layer surrounding the first electrode and electrically connected to the first electrode; and
   a second electrode fully enclosing the photosensitive organic layer and electrically connected to the photosensitive organic layer, wherein the organic layer comprises at least one upconverter material, anti-Stokes material, laser dye, anti-counterfeiting dye, quantum dot, or combination thereof,
   wherein (a) the second electrode is a continuous reflective metal layer having a thickness of about 100 nm to about 1 μm; or (b) the apparatus comprises a reflective and continuous external metal contact fully enclosing the second electrode; or (c) the second electrode is reflective and the apparatus comprises a reflective and continuous external metal contact fully enclosing the second electrode; and
   wherein the apparatus is operable to pass radiation into the photosensitive organic layer from the interior of the fiber core.

2. The photovoltaic apparatus of claim 1, wherein the radiation transmissive first electrode comprises a radiation transmissive conducting oxide.

3. The photovoltaic device of claim 2, wherein the radiation transmissive conducting oxide comprises indium tin oxide, gallium indium tin oxide, antimony tin oxide, or zinc indium tin oxide.

4. The photovoltaic apparatus of claim 1, wherein the photosensitive organic layer comprises a photoactive region.

5. The photovoltaic apparatus of claim 4, wherein the photoactive region comprises at least one bulk heterojunction between a donor material and an acceptor material.

6. The photovoltaic apparatus of claim 5, wherein the donor material comprises a polymeric phase and the acceptor material comprises a nanoparticle phase.

7. The photovoltaic apparatus of claim 6, wherein the polymeric phase comprises a conjugated polymer.

8. The photovoltaic apparatus of claim 7, wherein the conjugated polymer comprises poly(3-hexylthiophene), poly(3-octylthiophene), or mixtures thereof.

9. The photovoltaic apparatus of claim 6, wherein the nanoparticle phase comprises fullerenes, carbon nanotubes, or mixtures thereof.

10. The photovoltaic apparatus of claim 9, wherein the fullerenes comprise 1-(3-methoxycarbonyl)propyl-1-phenyl $(6,6)C_{61}$.

11. The photovoltaic apparatus of claim 6, wherein the donor material comprises organometallic compounds.

12. The photovoltaic apparatus of claim 11, wherein the organometallic compounds comprise phthalocyanines, porphyrins, or derivatives thereof.

13. The photovoltaic apparatus of claim 1, wherein the at least one upconverter material comprises a Lanthanide series element.

14. The photovoltaic apparatus of claim 1, wherein the at least one upconverter material comprises erbium, ytterbium, dysprosium, holmium, or mixtures thereof.

15. The photovoltaic apparatus of claim 1, wherein the at least one quantum dot comprises a III/V semiconductor material, a II/VI semiconductor material, or mixture thereof.

16. The photovoltaic apparatus of claim 1, wherein the at least one counterfeiting dye comprises a phosphor, fluorophor, thermochromic chemical species, photochromic chemical species, or a mixture thereof.

17. The photovoltaic apparatus of claim 1, wherein at least one end of the optical fiber core is beveled.

18. The photovoltaic apparatus of claim 1, wherein both ends of the optical fiber core are beveled.

19. The photovoltaic apparatus of claim 1, wherein the optical fiber core has a diameter ranging from about 10 µm to about 1 mm.

20. The photovoltaic apparatus of claim 1, further comprising an exciton blocking layer adjacent to the photosensitive organic layer.

21. The photovoltaic apparatus of claim 20, wherein the exciton blocking layer is etched.

22. The photovoltaic apparatus of claim 1 comprising a plurality of photosensitive organic layers.

23. A photovoltaic apparatus comprising:
an optical fiber core;
a radiation transmissive first electrode surrounding the optical fiber core;
at least one photosensitive organic layer surrounding the first electrode and electrically connected to the first electrode;
a second electrode surrounding the organic layer and electrically connected to the organic layer, wherein the organic layer comprises at least one upconverter material, anti-Stokes material, laser dye, anti-counterfeiting dye, quantum dot, or combination thereof; and
a reflective external metal contact fully enclosing the second electrode, wherein the apparatus is operable to pass radiation into the photosensitive organic layer from the interior of the optical fiber core.

* * * * *